US007984326B2

(12) United States Patent
Bland et al.

(10) Patent No.: US 7,984,326 B2
(45) Date of Patent: Jul. 19, 2011

(54) MEMORY DOWNSIZING IN A COMPUTER MEMORY SUBSYSTEM

(75) Inventors: Patrick M. Bland, Raleigh, NC (US); Jimmy G. Foster, Sr., Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 12/465,702

(22) Filed: May 14, 2009

(65) Prior Publication Data

US 2010/0293410 A1    Nov. 18, 2010

(51) Int. Cl.
G06F 11/00    (2006.01)
(52) U.S. Cl. .................. 714/6.13; 714/6.2; 714/36
(58) Field of Classification Search .............. 714/8, 36, 714/712, 715, 6.13, 6.2
See application file for complete search history.

(56) References Cited

U.S. PATENT DOCUMENTS

| | | | |
|---|---|---|---|
| 5,774,242 A * | 6/1998 | O'Sullivan et al. ............. 398/29 | |
| 5,790,447 A | 8/1998 | Laudon et al. | |
| 6,530,033 B1 | 3/2003 | Raynham et al. | |
| 6,862,249 B2 * | 3/2005 | Kyung ................... 365/233.17 | |
| 7,353,443 B2 * | 4/2008 | Sharma .................... 714/742 | |
| 7,366,947 B2 * | 4/2008 | Gower et al. .................... 714/8 | |
| 7,370,238 B2 * | 5/2008 | Billick et al. .................... 714/36 | |
| 7,370,243 B1 | 5/2008 | Grohoski et al. | |
| 7,640,463 B2 * | 12/2009 | Windler et al. ............ 714/707 | |
| 2005/0102568 A1 | 5/2005 | Billick et al. | |
| 2006/0206764 A1 * | 9/2006 | Lu et al. ...................... 714/36 | |

OTHER PUBLICATIONS

Nagaraja, et al.; Quantifying and Improving the Availability of High-Performance Cluster-Based Internet Services; 2003; ACM; Phoenix, AZ.
Tang, et al; Low Traffic Overlay Networks With Large Routing Tables; Sigmetrics; 2005; pp. 14-25; Banff; Alberta Canada.

* cited by examiner

Primary Examiner — Joshua A Lohn
(74) Attorney, Agent, or Firm — Edward J. Lenart; Cynthia G. Seal; Biggers & Ohanian, LLP

(57) ABSTRACT

Memory downsizing in a computer memory subsystem, the subsystem including one or more channels of computer memory with each channel including several Dual In-line Memory Modules ('DIMMs') and each DIMM capable of on-die termination ('ODT'). Memory downsizing according to embodiments of the present invention includes identifying, during a memory initialization test in a Power On Self Test ('POST') by a firmware module, a defective DIMM of a particular channel in the computer memory subsystem and disabling, by the firmware module, the defective DIMM, including enabling ODT for the defective DIMM without disabling any non-defective DIMMs.

15 Claims, 5 Drawing Sheets

MEMORY DOWNSIZING IN A COMPUTER MEMORY SUBSYSTEM

BACKGROUND OF THE INVENTION

1. Field of the Invention

The field of the invention is data processing, or, more specifically, methods, apparatus, and products for memory downsizing in a computer memory subsystem.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Advances in computer systems are largely dependent upon advances in computer memory. In computer systems today, for example, computer memory subsystems often include many different modules of memory, multiple Dual In-line Memory Modules ('DIMMs') for example, in many different configurations. In some computer memory subsystems DIMMs are configured in channels. In current computer systems, upon startup of the computer system, a firmware module such as BIOS or EFI runs a memory initialization test to determine if the DIMMs in each channel are defective. If the firmware determines that a DIMM is defective, in current art, the firmware proceeds to downsize memory by disabling, that is, de-allocating or mapping out of available system memory, all DIMMs in the same channel located behind the defective DIMM—whether defective of not. A DIMM is said to be 'behind' another DIMM in a channel when the DIMM is located physically further away from a memory controller in the data path than the other DIMM. In some cases according to memory downsizing methods of the current art, all DIMMs in a channel may be disabled, even all DIMMs in the computer system, even if many of the DIMMs are non-defective.

SUMMARY OF THE INVENTION

Methods, apparatus, and products for memory downsizing in a computer memory subsystem are disclosed in which the computer memory subsystem includes one or more channels of computer memory with each channel including several Dual In-line Memory Modules ('DIMMs') and each DIMM capable of on-die termination ('ODT'). Memory downsizing according to embodiments of the present invention includes identifying, during a memory initialization test in a Power On Self Test ('POST') by a firmware module, a defective DIMM of a particular channel in the computer memory subsystem and disabling, by the firmware module, the defective DIMM, including enabling ODT for the defective DIMM without disabling any non-defective DIMMs.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
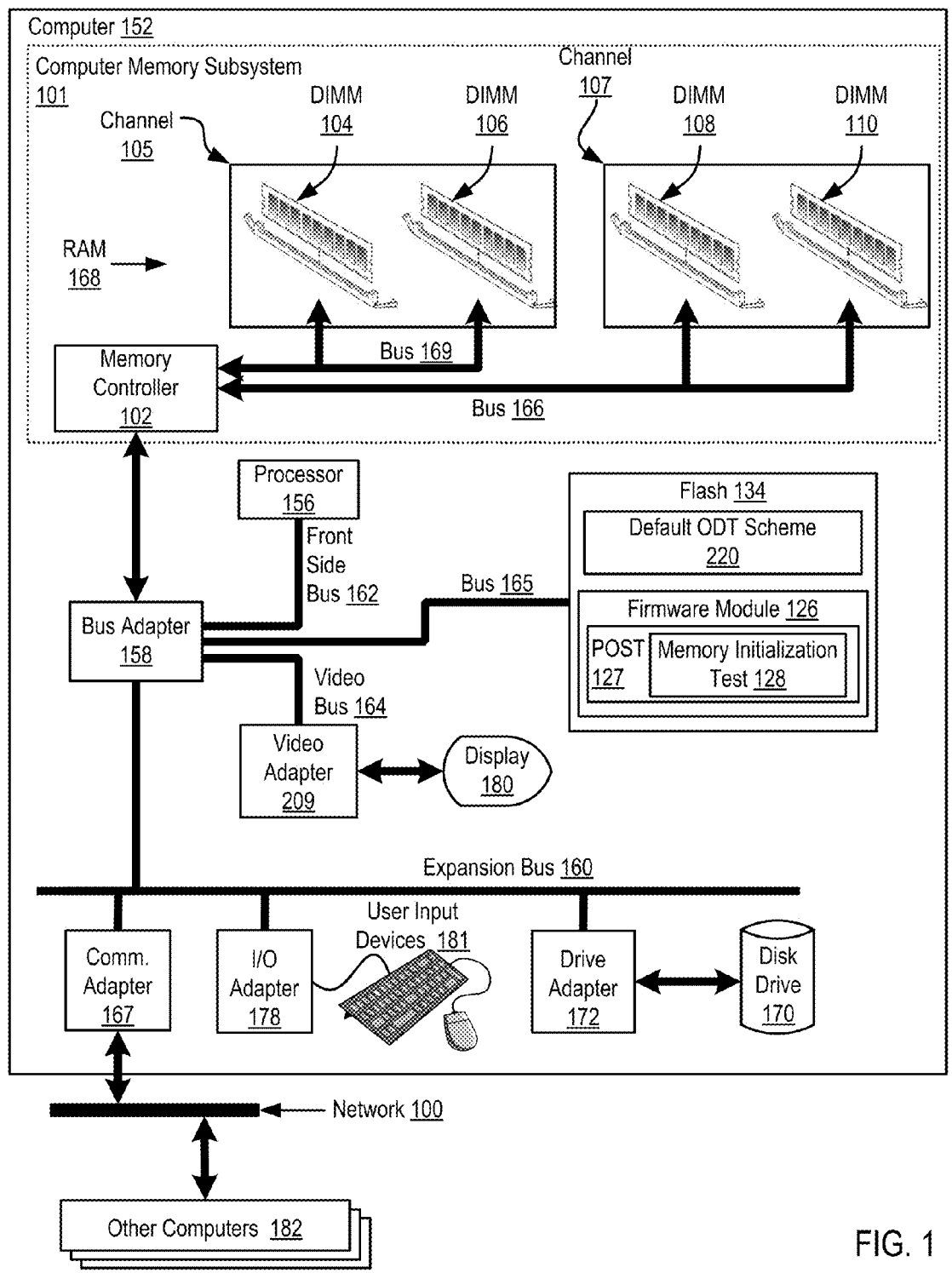
FIG. 1 sets forth a block diagram of an exemplary system for memory downsizing in a computer memory subsystem (101) according to embodiments of the present invention.

Exemplary methods, apparatus, and products for memory downsizing in a computer memory subsystem in accordance with the present invention are described with reference to the accompanying drawings, beginning with FIG. 1. FIG. 1 sets forth a block diagram of an exemplary system for memory downsizing in a computer memory subsystem (101) according to embodiments of the present invention.

The system of FIG. 1 includes a computer (152) which in turn includes at least one computer processor (156) or 'CPU' as well as random access memory (168) ('RAM') which is connected through high speed memory buses (166,169), memory controller (102), and bus adapter (158) to processor (156) and to other components of the computer (152). The RAM (168), memory buses (166,167), and memory controller (102) in the example system of FIG. 1 make up a computer memory subsystem (101) of the computer (152). A computer memory subsystem (101) as the term is used in this specification refers to an aggregation of computer hardware that includes at least several Dual In-line Memory Modules ('DIMMs') organized in one or more channels. Although the example computer memory subsystem (101) includes only memory buses, memory controller, and Random Access Memory ('RAM'), computer memory subsystems useful in systems that memory downsize according to embodiments of the present invention may include any number of variety of components, including for example, Flash memory, EEPROM, Direct Memory Access ('DMA') engines, and so on as will occur to readers of skill in the art.

The RAM (168) in the example of FIG. 1 is implemented with four DIMMs (104, 106, 108, 110). A DIMM is a module, typically implemented with Printed circuit board, that contains a series of Dynamic RAM integrated circuits. The DIMMs (104, 106, 108, 110) in the example computer memory subsystem (101) of FIG. 1 are organized in channels (105, 107) with two DIMMs assigned to each channel. A channel of memory is a grouping of memory in which each group, that is, each channel, has separate access to a memory controller. Each DIMM in the example of FIG. 1 is capable of on-die termination ('ODT'). ODT refers to semiconductor chips, such as memory modules of each DIMM in the example of FIG. 1, in which a termination resistor used for impedance matching in transmission lines is located inside a semiconductor chip itself, instead of on a printed circuit board or a motherboard in the computer system (102).

Also connected to the components of the computer (152) through the bus (165) is non-volatile memory in the form of Flash memory (134). Stored in flash memory (134) of the computer (152) is a firmware module (126), a module of computer program instructions that is executed upon startup of the computer, prior to bootloading an operating system in RAM or loading any other user-level applications. The firmware module (126), upon startup of the computer (152), executes a Power On Self Test ('POST'), which identifies, verifies, and initializes various components of the computer, both software and hardware components, for normal, user-level operations. Examples of tasks carried out by the firmware (126) during POST may include:

verifying integrity of the firmware code itself,
  discovering, initializing, and cataloging system buses and devices connected to the buses;
  passing operational control to specialized firmware modules of various computer components, such as a video adapter or audio adapter;
  providing a user interface for system configuration preferences;
  identifying, organizing, and selecting devices that are available for booting;
  constructing a system environment required by an operating system to be bootloaded into RAM for user-level operations; and
  initialization computer memory, including finding, determining the size of, and verifying the memory The firmware module (126), in addition to the above typical prior art tasks carried out during POST, is also configured to downsize memory according to embodiments of the present invention. Examples of firmware modules which may be configured for memory downsizing according to embodiments of the present invention include Basic Input/Output Systems ('BIOS') and the Extensible Firmware Interface ('EFI'), as well as other modules as will occur to readers of skill in the art. The firmware (126) may carry out memory downsizing according to embodiments of the present invention by identifying, during a memory initialization test (128) in POST, a defective DIMM of a particular channel in the computer memory subsystem (101); and disabling the defective DIMM, including enabling ODT for the defective DIMM without disabling any non-defective DIMMs.

The firmware module (126) may continue with memory downsizing by enabling ODT for the defective DIMM without disabling any non-defective DIMMs by setting ODT values for each DIMM according to a predefined default ODT scheme (220). The firmware may set ODT values in a DIMM by asserting various signals in a mode register of the memory controller (102), where the signals in mode register are designated for such a purpose. An ODT scheme, as the term is used in this specification, refers to a data structure that specifies ODT values for memory reads and memory writes. Consider the ODT values in the following two tables as examples of ODT schemes for two DIMM per channel memory topologies in which the DIMMs are configured with varying combination of single and dual rank DIMMs. In Tables 1 and 2 below, one particular scheme is defined for each combination of signal and dual rank DIMMS consisting of a scheme for memory reads in combination with a scheme for memory writes. The term 'rank' refers to the number of independent sets of DRAM modules that can be accessed for a full data bit-width. Table 1 below includes ODT values of DIMMs during memory reads and Table 2 includes ODT values of DIMMs for memory writes.

TABLE 1

ODT Values For Memory Reads In A Two DIMM Per Channel Memory Topology

| Slot 1 | Slot 2 | Read From | Slot 1 Rank 1 | Slot 1 Rank 2 | Slot 2 Rank 1 | Slot 2 Rank 2 |
|---|---|---|---|---|---|---|
| Double Rank | Double Rank | Slot 1 | ODT off | ODT off | ODT off | Rtt_Nom |
| | | Slot 2 | ODT off | Rtt_Nom | ODT off | ODT off |
| Double Rank | Single Rank | Slot 1 | ODT off | ODT off | Rtt_Nom | NA |
| | | Slot 2 | ODT off | Rtt_Nom | ODT off | NA |
| Single Rank | Double Rank | Slot 1 | ODT off | NA | ODT off | Rtt_Nom |
| | | Slot 2 | Rtt_Nom | NA | ODT off | ODT off |
| Single Rank | Single Rank | Slot 1 | ODT off | NA | Rtt_Nom | NA |
| | | Slot 2 | Rtt_Nom | NA | ODT off | NA |
| Double Rank | Empty/Disabled | Slot 1 | ODT off | ODT off | NA | NA |
| Empty/Disabled | Double Rank | Slot 2 | NA | NA | ODT off | ODT off |
| Single Rank | Empty/Disabled | Slot 1 | ODT OFF | NA | NA | NA |
| Empty/Disabled | Single Rank | Slot 2 | NA | NA | ODT off | NA |

TABLE 2

ODT Values For Memory Writes In A Two DIMM Per Channel Memory Topology

| Slot 1 | Slot 2 | Write To | Slot 1 Rank 1 | Slot 1 Rank 2 | Slot 2 Rank 1 | Slot 2 Rank 2 |
|---|---|---|---|---|---|---|
| Double Rank | Double Rank | Slot 1 | Rtt_WR | ODT off | ODT off | Rtt_Nom |
| | | Slot 2 | ODT off | Rtt_Nom | Rtt_WR | ODT off |
| Double Rank | Single Rank | Slot 1 | Rtt_WR | ODT off | Rtt_Nom | NA |
| | | Slot 2 | ODT off | Rtt_Nom | Rtt_WR | NA |
| Single Rank | Double Rank | Slot 1 | Rtt_WR | NA | ODT off | Rtt_Nom |
| | | Slot 2 | Rtt_Nom | NA | Rtt_WR | ODT off |
| Single Rank | Single Rank | Slot 1 | Rtt_WR | NA | Rtt_Nom | NA |
| | | Slot 2 | Rtt_Nom | NA | Rtt_WR | NA |
| Double Rank | Empty/Disabled | Slot 1 | Rtt_WR | ODT off | NA | NA |
| Empty/Disabled | Double Rank | Slot 2 | NA | NA | Rtt_WR | ODT off |
| Single Rank | Empty/Disabled | Slot 1 | Rtt_WR | NA | NA | NA |
| Empty/Disabled | Single Rank | Slot 2 | NA | NA | Rtt_WR | NA |

In the tables above, the ODT values are represented by Rtt_WR and Rtt_Nom which are types of ODT impedances, the values of which are configurable. In many DIMMs of the prior art, Rtt_Nom is a nominal ODT impedance used in a DIMM to terminate data and data strobe transmission lines when in standby or when during memory writes if Rtt_WR is not enabled. Rtt_WR is a type of ODT impedance used in a DIMM during memory writes when enabled. Both Rtt_Nom and Rtt_WR may be disabled completely in a DIMM or set to one of many different impedance values, such as 40 ohms, 60 ohms, 120 ohms, and so on. A disabled ODT value is represented above as ODT off and NA indicates the absence of memory for the particular configuration. As described in this specification, different ODT schemes may not only specify different types of ODT impedances for each DIMM configuration—Rtt_Nom, Rtt_WR, and ODT off—but different schemes may also specify different values for the each type—20 ohms for Rtt_Nom, 60 ohms Rtt_WR and so on.

Consider, as an example of memory downsizing in the computer memory subsystem (101) of the computer (152) of FIG. 1, that the firmware module (126) identifies DIMM (108) as a defective DIMM. In prior art systems that downsize memory, the firmware module (126) would disable DIMM (110) as well as DIMM (108), mapped out of available physical memory. If each DIMM in the example of FIG. 1 represents an identical amount of memory, 2 gigabytes (GB), for example, the amount of physical memory available in such a prior art computer (152) system is reduced in half, from 8 GB to 4 GB. In systems that operate for memory downsizing according to embodiments of the present invention, by contrast, the firmware module (126) enables ODT termination for all DIMMs, both defective and non-defective, while disabling only the defective DIMM. Continuing with the example of identical 2 GB DIMMs, in systems that downsize memory according to embodiments of the present invention only one DIMM, the defective DIMM (108) is disabled as available physical memory, while the other DIMMs (104, 106, 110) remain enabled and available—a reduction of only 2 GB, leaving 6 GB of available memory.

Although memory downsizing is described largely in the specification with respect to entire DIMMs, readers of skill in the art will recognize that memory downsizing in accordance with embodiments of the present invention may also be carried with respect to portions of a DIMM, DIMM ranks. As described above, ODT is typically applied at the rank level, not the entire DIMM level, so in some embodiments only a defective rank of a DIMM is disabled while non-defective ranks of the same DIMM as well as ranks of other non-defective DIMMs remain enabled.

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers that downsize memory according to embodiments of the present invention include Integrated Drive Electronics ('IDE') adapters, Small Computer System Interface ('SCSI') adapters, and others as will occur to those of skill in the art. Non-volatile memory may also be implemented for the computer as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for memory downsizing according to embodiments of the present invention include modems for wired dial-up communications, Ethernet (IEEE 802.3) adapters for wired data communications network communications, and 802.11 adapters for wireless data communications network communications.

The arrangement of firmware module (126), POST (127), memory initialization test (128), computer memory subsystem, channels, DIMMs, and other devices making up the exemplary system illustrated in FIG. 1 are for explanation, not for limitation. Data processing systems useful according to various embodiments of the present invention may include additional DIMMs, computer memory subsystems, buses, controllers, servers, routers, and other devices, not shown in FIG. 1 as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
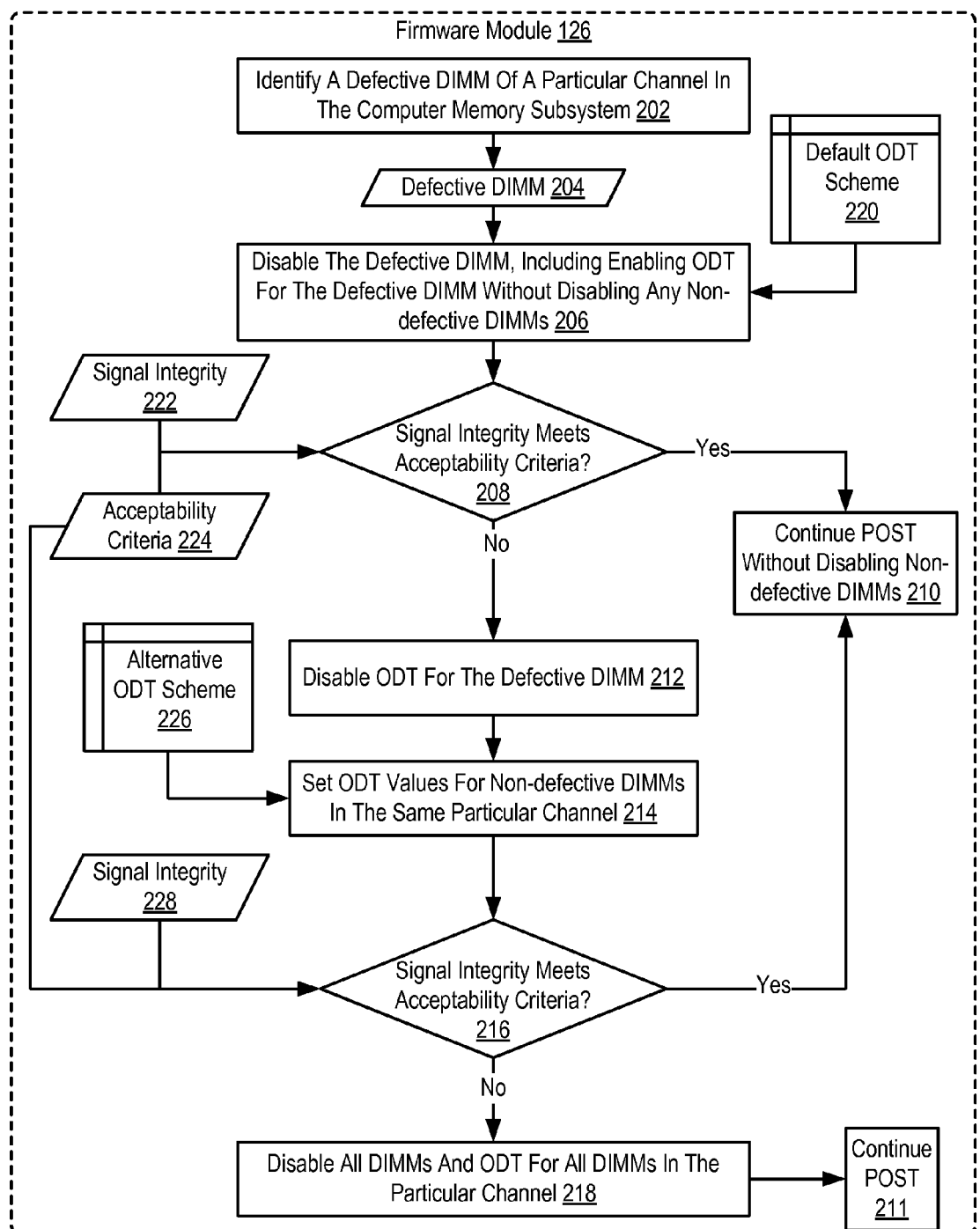
FIG. 2 sets forth a flow chart illustrating an exemplary method for downsizing memory in a computer memory subsystem according to embodiments of the present invention.

For further explanation, FIG. 2 sets forth a flow chart illustrating an exemplary method for downsizing memory in a computer memory subsystem according to embodiments of the present invention. The method of FIG. 2 is carried out for a computer memory subsystem similar to the computer memory subsystem (101) depicted in the example computer (152) of FIG. 1. The computer memory subsystem (101 on FIG. 1) includes one or more channels (105, 107 on FIG. 1) of memory, with each channel (105, 107) including several DIMMs (104, 106, 108, 110 on FIG. 1) and each DIMM capable of ODT.

The method of FIG. 2 includes identifying (202), during a memory initialization test in a Power On Self Test ('POST') by a firmware module (126), a defective DIMM (204) of a particular channel in the computer memory subsystem. Identifying (202) a defective DIMM (204) of a particular channel in the computer memory subsystem may be carried out in various ways including, for example, by implementing a predictive failure analysis ('PFA') algorithm which identifies excessive errors in DIMMs with writes to and reads from memory of predefined data and in other ways as will occur to readers of skill in the art.

The method of FIG. 2 also includes disabling (206), by the firmware module (126), the defective DIMM (204), including enabling ODT for the defective DIMM without disabling any non-defective DIMMs. Disabling (206) the defective DIMM (204) may be carried out by de-allocating or un-mapping, through a memory controller, the physical address space from available system memory in the computer memory subsystem. Enabling ODT for the defective DIMM without disabling any non-defective DIMMs may be carried out by instructing a memory controller to set ODT values in the DIMMs, defective and non-defective, according to a predefined default ODT scheme. The firmware module may instruct a memory controller as such by writing values in a mode register of the memory controller, where the mode register is designated for such a purpose.

The method of FIG. 2 also includes determining (208), by the firmware module (126), whether signal integrity (222) for the computer memory subsystem meets acceptability criteria (224) when ODT is enabled for the defective DIMM. Signal integrity (222) as the term is used here may refer to the integrity of any signal carried on a transmission line of a DIMM. In some embodiments, for example, signal integrity refers to the integrity of signals carried on the data and data strobe transmission lines. Acceptability criteria as the term is used here refers to one or more predefined values with which the firmware compares tested signal integrity. In some embodiments, the defective DIMM may be defective in that ODT for the DIMM is defective. In these embodiments then, enabling ODT for the defective DIMM may produce deficient or substandard signal integrity in the computer memory subsystem. If not and the signal integrity (222) meets such acceptability criteria (224), the method of FIG. 2 resumes by continuing (210), by the firmware module (126), the POST without disabling any non-defective DIMMs in the same particular channel as the defective DIMM.

If signal integrity (222) does not meet the acceptability criteria (224), the method of FIG. 2 continues by disabling (212), by the firmware module (126), ODT for the defective DIMM (204). The method of FIG. 2 also includes setting (214), by the firmware module (126), ODT values for non-defective DIMMs in the same particular channel as the defective DIMM according to an alternative ODT scheme (226). An alternative ODT scheme is an ODT scheme other than a default ODT scheme as described above. Even if ODT for the defective DIMM must be disabled, some embodiments of the present invention include enabling ODT for the non-defective DIMMs. In prior art, by contrast non-defective DIMMs behind the defective DIMM in the same channel are de-allocated from available system memory and ODT for such DIMMs is disabled as well.

The method of FIG. 2 also includes determining (216), by the firmware module (126), whether signal integrity (228) for the computer memory subsystem meets acceptability criteria (224) when ODT is set according to the alternative ODT scheme (226). If signal integrity (228) meets the acceptability criteria (224), the method of FIG. 2 resumes by continuing (210), by the firmware module (126), the POST without disabling any non-defective DIMMs in the same particular channel as the defective DIMM (214). If signal integrity (228) does not meet the acceptability criteria (224), all DIMMs behind the defective DIMM are disabled (218) and the firmware module continues (211) with POST.

Figure 3:
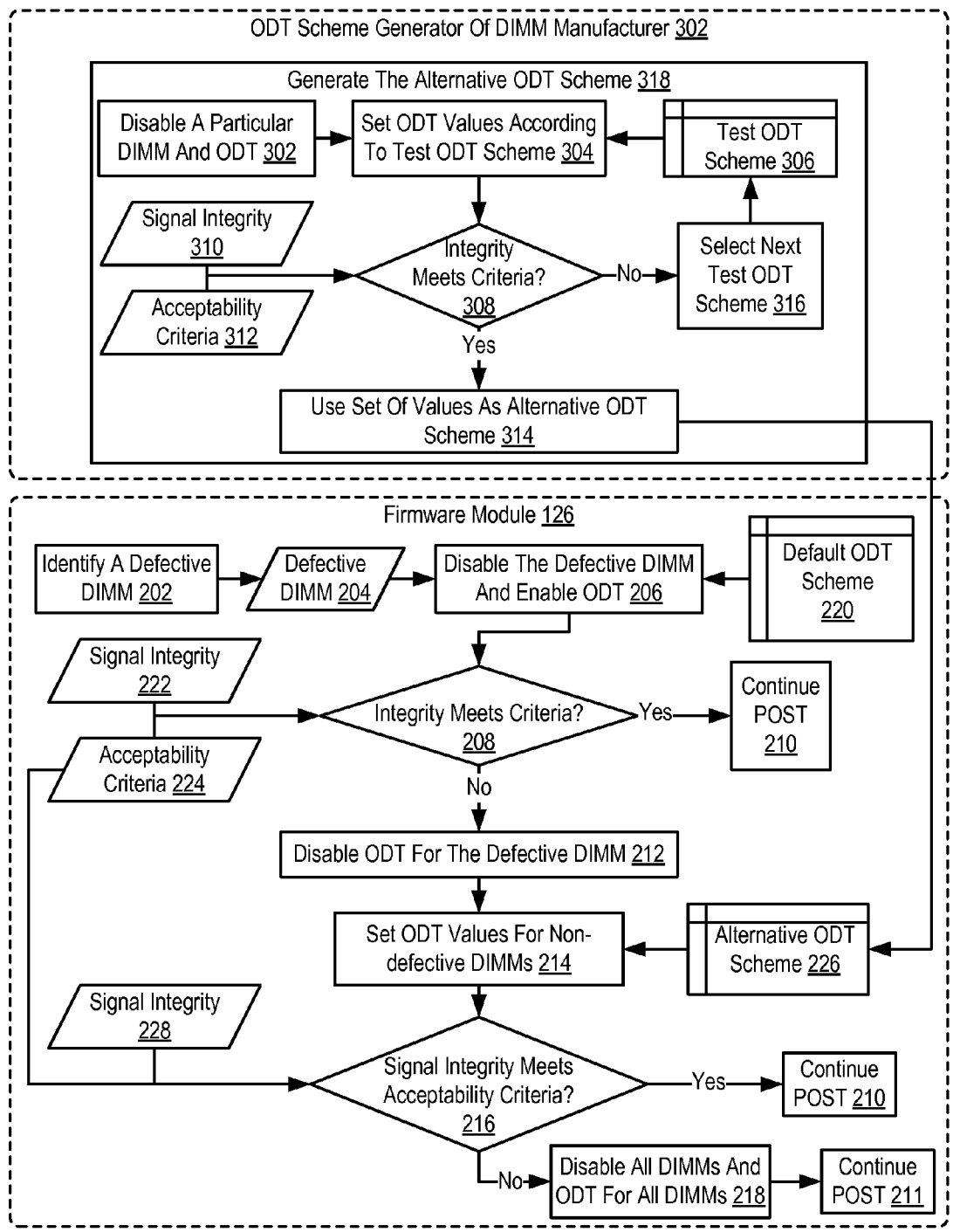
FIG. 3 sets forth a flow chart illustrating a further exemplary method for memory downsizing in a computer memory subsystem according to embodiments of the present invention.

For further explanation, FIG. 3 sets forth a flow chart illustrating a further exemplary method for memory downsizing in a computer memory subsystem according to embodiments of the present invention. The method of FIG. 3 is similar to the method of FIG. 2 in that the method of FIG. 3 is also carried out for a computer memory subsystem similar to the computer memory subsystem (101) depicted in the example computer (152) of FIG. 1 which includes one or more channels (105, 107 on FIG. 1) of memory, with each channel (105, 107) including several DIMMs (104, 106, 108, 110 on FIG. 1) and each DIMM capable of ODT.

The method of FIG. 3 is also similar to the method of FIG. 2, including as it does: identifying (202) a defective DIMM (204); disabling (206) the defective DIMM (204) and enabling ODT for the defective DIMM; determining (208) whether signal integrity (222) meets acceptability criteria (224); if signal integrity (222) meets the acceptability criteria (224), continuing (210) the POST; if signal integrity (222) does not meet the acceptability criteria (224), disabling (212) ODT for the defective DIMM (204); setting (214) ODT values for non-defective DIMMs according to an alternative ODT scheme (226); determining (216) whether signal integrity (228) meets acceptability criteria (224); and if signal integrity (228) meets the acceptability criteria (224), continuing (210) the POST.

The method of FIG. 3 differs from the method of FIG. 2, however, in that the method of FIG. 3 includes generating (318), by a manufacturer of the computer memory subsystem at manufacture time through use of an ODT scheme generator (302), the alternative ODT scheme (226). An ODT generator is a module of automated computing machinery which operates to generate ODT schemes. In the method of FIG. 3, generating (318) the alternative ODT scheme (226) is carried out by: iteratively, for a plurality of test ODT schemes, until signal integrity under normal operating conditions meets acceptability criteria: disabling (302), by the ODT scheme generator (302), a particular DIMM in a channel of DIMMs and ODT of the particular DIMM, setting (304), by the ODT scheme generator (302), ODT values for other DIMMs in the same channel as the disabled DIMM according to a test ODT scheme (306); determining whether signal integrity (310) for the channel of DIMMs under normal operating conditions meets acceptability criteria (310); if signal integrity (310) does not meet the acceptability criteria (312), selecting (316) a next test ODT scheme (306); and if signal integrity (310) does meet the acceptability criteria (312), using (314) the test ODT scheme (306) as the alternative ODT scheme (226). That is, according to some embodiments of the present invention, the generator sets ODT values according to a first test ODT scheme, signal integrity is tested, and if the signal integrity does not meet the acceptability criteria, a next ODT scheme is selected in which only one ODT value is varied, the generator sets ODT values according to the next ODT scheme, signal integrity is again tested and so on until signal integrity meets the acceptability criteria. The first ODT scheme used to set ODT values in the DIMM in which signal integrity meets acceptability criteria is selected by the generator as the alternative ODT scheme. In this way, a manufacturer may generate an alternative ODT scheme to be used with classes, sets, or groups of computer memory subsystems having similar configurations; 2 DIMMs per channel, 3 DIMMs per channel, or 4 DIMMs per channel for example. Such alternative ODT schemes may also be specific to particular models of DIMMs, such as DDR3 667 MHz DIMMs, and so on. In some embodiments, the scheme generator is configured to use a predefined number of test ODT schemes in generating the alternative test ODT scheme or to attempt to generate the scheme within a predefined period of time. If the scheme generator is unable to identify a test ODT scheme with which signal integrity meets criteria within the predefined number of test ODT schemes or within the predefined period of time, depending on the embodiment, no alternative test scheme is generated (not shown in FIG. 3).

Figure 4:
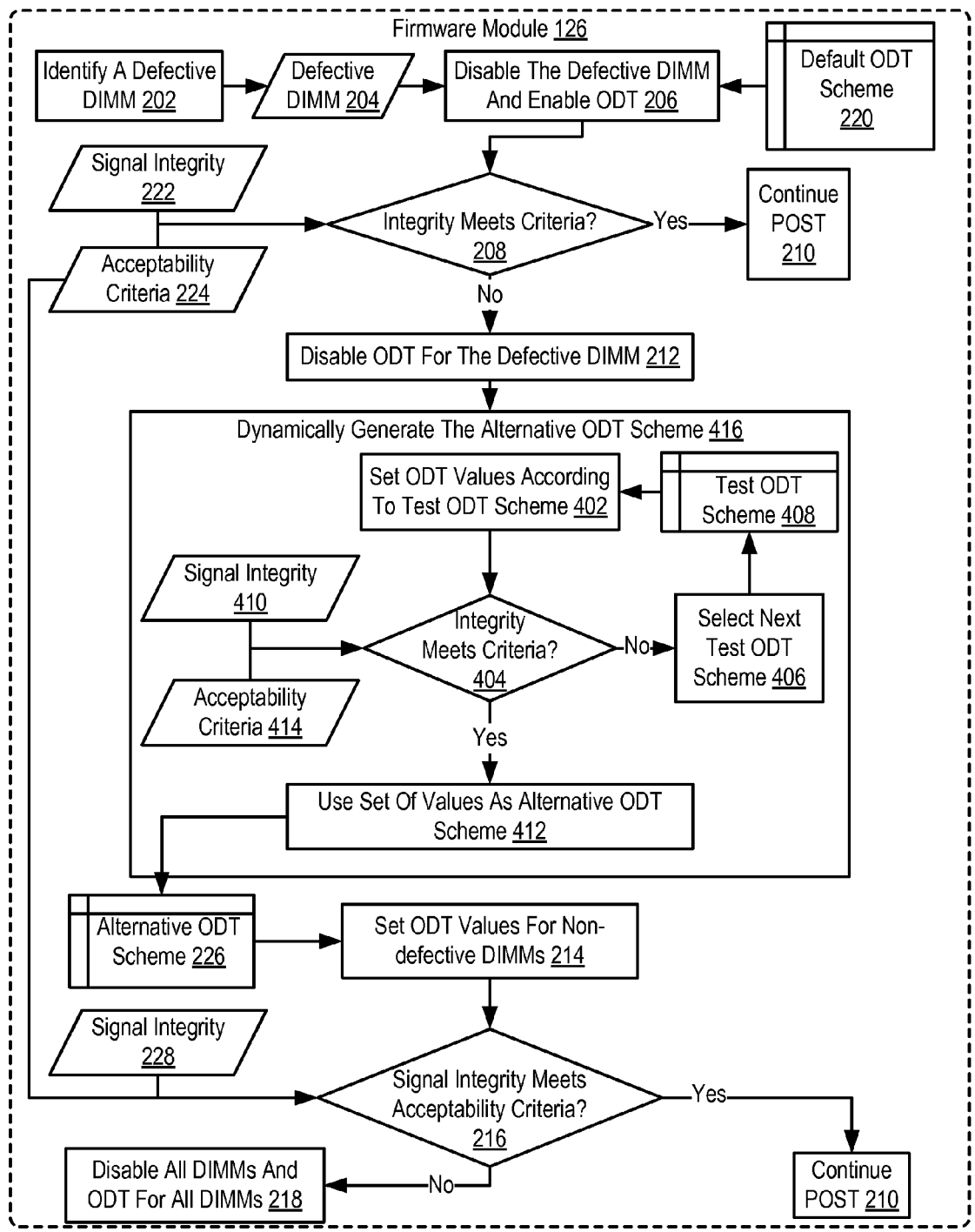
FIG. 4 sets forth a flow chart illustrating a further exemplary method for memory downsizing in a computer memory subsystem according to embodiments of the present invention.

For further explanation, FIG. 4 sets forth a flow chart illustrating a further exemplary method for memory downsizing in a computer memory subsystem according to embodiments of the present invention. The method of FIG. 4 is similar to the method of FIG. 2 in that the method of FIG. 4 is also carried out for a computer memory subsystem similar to the computer memory subsystem (101) depicted in the example computer (152) of FIG. 1 which includes one or more channels (105, 107 on FIG. 1) of memory, with each channel (105, 107) including several DIMMs (104, 106, 108, 110 on FIG. 1) and each DIMM capable of ODT.

The method of FIG. 4 is also similar to the method of FIG. 2, including as it does: identifying (202) a defective DIMM (204); disabling (206) the defective DIMM (204) and enabling ODT for the defective DIMM; determining (208) whether signal integrity (222) meets acceptability criteria (224); if signal integrity (222) meets the acceptability criteria (224), continuing (210) the POST; if signal integrity (222) does not meet the acceptability criteria (224), disabling (212) ODT for the defective DIMM (204); setting (214) ODT values for non-defective DIMMs according to an alternative ODT scheme (226); determining (216) whether signal integrity (228) meets acceptability criteria (224); and if signal integrity (228) meets the acceptability criteria (224), continuing (210) the POST.

The method of FIG. 4 differs from the method of FIG. 2, however, in that the method of FIG. 4 includes dynamically generating (416), by the firmware module (126) upon determining that the ODT for the defective DIMM adversely affects signal integrity in the computer memory subsystem, the alternative ODT scheme (226). In the example of FIG. 4, dynamically generating (416) the alternative ODT scheme (226) is carried out by iteratively, for a plurality of test ODT schemes, until signal integrity under normal operating conditions meets acceptability criteria: setting (402) ODT values for the non-defective DIMMs in the same particular channel as the defective DIMM according to a test ODT scheme (408); determining (404) whether signal integrity (410) for the particular channel of DIMMs under normal operating conditions meets acceptability criteria (414); if signal integrity (410) does not meet the acceptability criteria (414), selecting (406) a next test ODT scheme (408); and if signal integrity (410) does meet the acceptability criteria (414), using (412) the test ODT scheme (408) as the alternative ODT scheme (226).

In some embodiments, like the scheme generator of FIG. 4, the firmware module (126) is configured to use a predefined number of test ODT schemes in generating the alternative test ODT scheme or to attempt to generate the scheme within a predefined period of time. If the firmware module (126) is unable to identify a test ODT scheme with which signal integrity meets acceptability criteria within the predefined number of test ODT schemes or within the predefined period of time, depending on the embodiment, no alternative test scheme is generated (not shown in FIG. 4).

An alternative ODT scheme is generated here by dynamically adjusting ODT values for clarity of explanation only, not limitation. In addition to dynamically adjusting ODT values to generate an alternative ODT scheme, readers of skill in the art will recognize that other parameters of the computer memory subsystem may be adjusted in order to generate such an alternative ODT scheme. Such parameters may include, for example, drive strength, ODT values of the memory controller itself, the voltage level of the drivers, the voltage level of the reference voltage, and so on as will occur to readers of skill in the art.

The term dynamically is used here to describe generating the alternative ODT scheme because the generation is carried out in real time, during POST, upon the identification of a defective DIMM, with respect to a particular computer memory subsystem including the defective DIMM, in contrast to generating such an alternative ODT scheme in a test environment, not with respect to a particular computer memory subsystem that includes a currently defective DIMM, such as described above with respect to FIG. 3. Further, In FIG. 3, in contrast to the dynamic generation described here in FIG. 4, the alternative ODT scheme is not computer memory subsystem-specific, but is instead applicable to a class, set, or group of computer memory subsystems in which similar DIMMs are installed in a similar architecture or memory configuration: 2 DIMMs per channel, 3 DIMMs per channel, or 4 DIMMs per channel for example.

Figure 5:
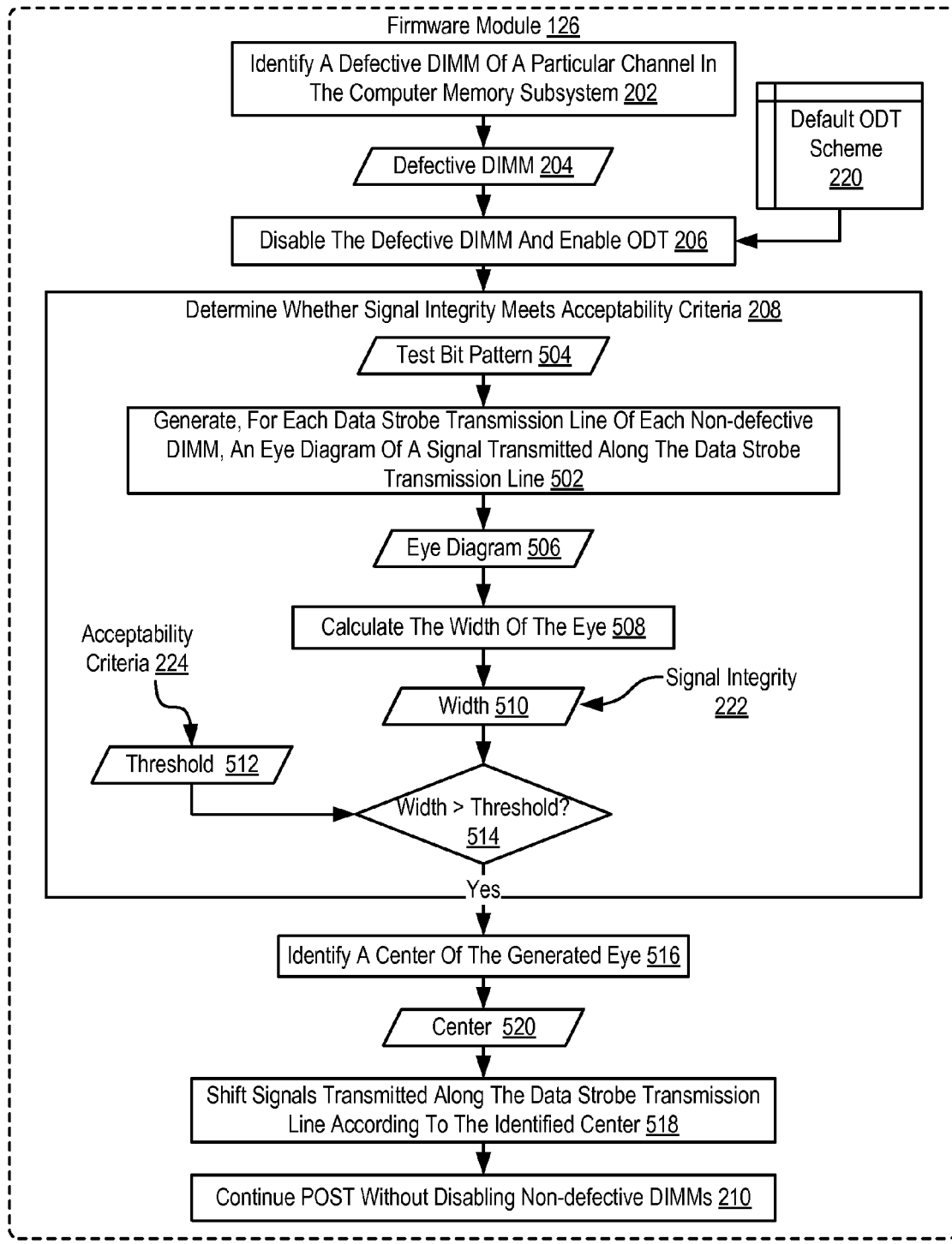
FIG. 5 sets forth a flow chart illustrating a further exemplary method for memory downsizing in a computer memory subsystem according to embodiments of the present invention.

For further explanation, FIG. 5 sets forth a flow chart illustrating a further exemplary method for memory downsizing in a computer memory subsystem according to embodiments of the present invention. The method of FIG. 5 is similar to the method of FIG. 2 in that the method of FIG. 5 is also carried out for a computer memory subsystem similar to the computer memory subsystem (101) depicted in the example computer (152) of FIG. 1 which includes one or more channels (105, 107 on FIG. 1) of memory, with each channel (105, 107) including several DIMMs (104, 106, 108, 110 on FIG. 1) and each DIMM capable of ODT.

The method of FIG. 5 is also similar to the method of FIG. 2, including as it does: identifying (202) a defective DIMM (204); disabling (206) the defective DIMM (204) and enabling ODT for the defective DIMM; determining (208) whether signal integrity (222) meets acceptability criteria (224); if signal integrity (222) meets the acceptability criteria (224), continuing (210) the POST; if signal integrity (222) does not meet the acceptability criteria (224), disabling (212) ODT for the defective DIMM (204); setting (214) ODT values for non-defective DIMMs according to an alternative ODT scheme (226); determining (216) whether signal integrity (228) meets acceptability criteria (224); and if signal integrity (228) meets the acceptability criteria (224), continuing (210) the POST.

The method of FIG. 5 differs from the method of FIG. 2, however, in that in the method of FIG. 5, determining (208) whether signal integrity (222) for the computer memory subsystem meets acceptability criteria (224) is carried out by generating (502), for each data strobe transmission line of each non-defective DIMM, an eye diagram (506) of the data strobe transmission line with a predefined test bit pattern (504); calculating (508) the width (510) of the eye of the generated eye diagram (506); and determining (514) whether the width (510) is greater than a predetermined threshold width (512).

An eye diagram or 'eye pattern' is an aggregation of values of a digital signal over a predefined time period, typically a clock cycle, where the values of the digital signal for each clock cycle are superimposed upon one another. Eye diagrams typically are displayed on a virtual or physical oscilloscope display. In embodiments of the present invention, however, an eye diagram may be generated with data values stored in a data structure, rather than on display. An eye diagram is so called because, for several types of coding, the pattern looks like one or more eyes between a pair of rails. The opening of the eye has a vertical height and a horizontal width which may be used to derive a number of communication channel performance measurements. Generally, an open eye diagram corresponds to minimal signal distortion along the transmission line, and a closure of an eye diagram corresponds to intersymbol interference and noise in the transmission line. Specifically, as vertical height of the eye opening decreases, the presence of additive noise in the signal increases and as the width of the eye opening decreases, the presence of jitter in the signal increases.

Generating (502) an eye diagram (506) may be carried out by: beginning at a predefined time shift and continuing until measured values do not reflect expected values: transmitting a test bit pattern along the data strobe transmission line; measuring values of the signal on the data strobe transmission line; determining, from the test bit pattern, whether the measured values reflect expected values; if the measured values reflect expected values, storing the values of the signal on the data strobe transmission line; and increasing the time shift of the data strobe transmission line. After increasing the time shift of the data strobe transmission line such that measured values of the signal on the data strobe transmission line do not reflect expected values, the firmware module then measures values of a test bit pattern transmitted along the data strobe transmission line, beginning again at the same predefined time shift, while incrementally decreasing the time shift until the measured values do not reflect expected values. The firmware module then superimposes those values that that reflect expected values upon one another, creating an eye pattern for signals transmitted along a data strobe transmission line.

A predefined test bit pattern is a string of digital data which is transmitted along the data strobe transmission line in a DIMM to generate an eye pattern. A data strobe transmission line is a transmission line used in DIMMs for encoding data written to and read from memory. Such a transmission line is typically also paired with a data transmission line. Such a data strobe transmission line is but one example transmission line, among many possible DIMM transmission lines, for which an eye diagram may be generated in order to determine whether signal integrity meets acceptability criteria according to embodiments of the present invention.

Calculating (508) the width (510) of the eye of the generated eye diagram (506) may be carried out by determining the difference between the increased time shift at which the measured value of the test bit pattern signal on the data strobe transmission line did not reflect expected values and the decreased time shift at which the measured value of the test bit pattern signal on the data strobe transmission line did not reflect expected values.

Determining (514) whether the width (510) is greater than a predetermined threshold width (512) may be carried out by comparing the value of the calculated width to the value of the predetermined threshold width.

Determining whether signal integrity meets acceptability criteria is described above with respect to step (208) in FIG. 5 for ease of explanation only. Readers of skill in the art will immediately recognize every instance in FIGS. 2, 3, and 4 of determining whether signal integrity meets acceptability criteria may be carried out exactly as described here.

If the calculated width (510) is greater than the predetermined threshold width (512), the method of FIG. 5 continues by identifying (516) a center (520) of the generated eye; and shifting (518) the data strobe transmission line according to the identified center. The center of the generated eye represents an optimized time shift for signals transmitted along the data strobe transmission line under current operating configuration of the defective and non-defective DIMMs. That is, setting the time shift of signals transmitted along the data strobe transmission line in accordance with the center of eye optimizes accurate signal transmission along that line under the particular ODT settings.

Exemplary embodiments of the present invention are described largely in the context of a fully functional computer system for memory downsizing in computer memory subsystems. Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web as well as wireless transmission media such as, for example, networks implemented according to the IEEE 802.11 family of specifications. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of memory downsizing in a computer memory subsystem, the computer memory subsystem comprising one or more channels of computer memory, each channel comprising a plurality of Dual In-line Memory Modules ('DIMMs'), each DIMM capable of on-die termination ('ODT'), the method comprising:

identifying, during a memory initialization test in a Power On Self Test ('POST') by a firmware module, a defective DIMM of a particular channel in the computer memory subsystem;

disabling, by the firmware module, the defective DIMM, including enabling ODT for the defective DIMM without disabling any non-defective DIMMs;

determining, by the firmware module, whether signal integrity for the computer memory subsystem meets acceptability criteria when ODT is enabled for the defective DIMM; and if signal integrity meets the acceptability criteria, continuing, by the firmware module, the POST without disabling any non-defective DIMMs in the same particular channel as the defective DIMM.

2. The method of claim 1 wherein:

determining whether signal integrity for the computer memory subsystem meets acceptability criteria further comprises:

generating, for each data strobe transmission line of each non-defective DIMM, an eye diagram of a signal transmitted along the data strobe transmission line with a predefined test bit pattern;

calculating the width of the eye of the generated eye diagram; and determining whether the width is greater than a predetermined threshold width; and if the calculated width is greater than the predetermined threshold width, the method further comprises:

identifying a center of the generated eye; and shifting signals transmitted along the data strobe transmission line according to the identified center.

3. The method of claim 1 further comprising, if signal integrity does not meet the acceptability criteria:

disabling, by the firmware module, ODT for the defective DIMM;

setting, by the firmware module, ODT values for non-defective DIMMs in the same particular channel as the defective DIMM according to an alternative ODT scheme;
determining, by the firmware module, whether signal integrity for the computer memory subsystem meets acceptability criteria when ODT is set according to the alternative ODT scheme; and
if signal integrity meets the acceptability criteria, continuing, by the firmware module, the POST without disabling any non-defective DIMMs in the same particular channel as the defective DIMM.

4. The method of claim 3 further comprising generating, by a manufacturer of the computer memory subsystem at manufacture time through use of a ODT scheme generator, the alternative ODT scheme, including:
iteratively, for a plurality of test ODT schemes, until signal integrity under normal operating conditions meets acceptability criteria:
disabling, by the ODT scheme generator, a particular DIMM in a channel of DIMMs and ODT of the particular DIMM;
setting, by the ODT scheme generator, ODT values for other DIMMs in the same channel as the disabled DIMM according to a test ODT scheme;
determining whether signal integrity for the channel of DIMMs under normal operating conditions meets acceptability criteria;
if signal integrity does not meet the acceptability criteria, selecting a next test ODT scheme; and
if signal integrity does meet the acceptability criteria, using the test ODT scheme as the alternative ODT scheme.

5. The method of claim 3 further comprising dynamically generating, by the firmware module upon determining that the ODT for the defective DIMM adversely affects signal integrity in the computer memory subsystem, the alternative ODT scheme, including:
iteratively, for a plurality of test ODT schemes, until signal integrity under normal operating conditions meets acceptability criteria:
setting ODT values for the non-defective DIMMs in the same particular channel as the defective DIMM according to a test ODT scheme;
determining whether signal integrity for the particular channel of DIMMs under normal operating conditions meets acceptability criteria;
if signal integrity does not meet the acceptability criteria, selecting a next test ODT scheme; and
if signal integrity does meet the acceptability criteria, using the test ODT scheme as the alternative ODT scheme.

6. An apparatus for memory downsizing in a computer memory subsystem, the computer memory subsystem comprising one or more channels of computer memory, each channel comprising a plurality of Dual In-line Memory Modules ('DIMMs'), each DIMM capable of on-die termination ('ODT'), the apparatus comprising a computer processor, a computer memory operatively coupled to the computer processor, the computer memory having disposed within it computer program instructions capable of:
identifying, during a memory initialization test in a Power On Self Test ('POST') by a firmware module, a defective DIMM of a particular channel in the computer memory subsystem;
disabling, by the firmware module, the defective DIMM, including enabling ODT for the defective DIMM without disabling any non-defective DIMMs; and
determining, by the firmware module, whether signal integrity for the computer memory subsystem meets acceptability criteria when ODT is enabled for the defective DIMM;
if signal integrity meets the acceptability criteria, continuing, by the firmware module, the POST without disabling any non-defective DIMMs in the same particular channel as the defective DIMM.

7. The apparatus of claim 6 wherein:
determining whether signal integrity for the computer memory subsystem meets acceptability criteria further comprises:
generating, for each data strobe transmission line of each non-defective DIMM, an eye diagram of a signal transmitted along the data strobe transmission line with a predefined test bit pattern;
calculating the width of the eye of the generated eye diagram; and
determining whether the width is greater than a predetermined threshold width; and
if the calculated width is greater than the predetermined threshold width, the method further comprises:
identifying a center of the generated eye; and
shifting signals transmitted along the data strobe transmission line according to the identified center.

8. The apparatus of claim 6 further comprising computer program instructions capable of, if signal integrity does not meet the acceptability criteria:
disabling, by the firmware module, ODT for the defective DIMM;
setting, by the firmware module, ODT values for non-defective DIMMs in the same particular channel as the defective DIMM according to an alternative ODT scheme;
determining, by the firmware module, whether signal integrity for the computer memory subsystem meets acceptability criteria when ODT is set according to the alternative ODT scheme; and
if signal integrity meets the acceptability criteria, continuing, by the firmware module, the POST without disabling any non-defective DIMMs in the same particular channel as the defective DIMM.

9. The apparatus of claim 8 further comprising computer program instructions capable of generating, by a manufacturer of the computer memory subsystem at manufacture time through use of a ODT scheme generator, the alternative ODT scheme, including:
iteratively, for a plurality of test ODT schemes, until signal integrity under normal operating conditions meets acceptability criteria:
disabling, by the ODT scheme generator, a particular DIMM in a channel of DIMMs and ODT of the particular DIMM;
setting, by the ODT scheme generator, ODT values for other DIMMs in the same channel as the disabled DIMM according to a test ODT scheme;
determining whether signal integrity for the channel of DIMMs under normal operating conditions meets acceptability criteria;
if signal integrity does not meet the acceptability criteria, selecting a next test ODT scheme; and
if signal integrity does meet the acceptability criteria, using the test ODT scheme as the alternative ODT scheme.

10. The apparatus of claim 8 further comprising computer program instructions capable of dynamically generating, by the firmware module upon determining that the ODT for the defective DIMM adversely affects signal integrity in the computer memory subsystem, the alternative ODT scheme, including:
    iteratively, for a plurality of test ODT schemes, until signal integrity under normal operating conditions meets acceptability criteria:
    setting ODT values for the non-defective DIMMs in the same particular channel as the defective DIMM according to a test ODT scheme;
    determining whether signal integrity for the particular channel of DIMMs under normal operating conditions meets acceptability criteria;
    if signal integrity does not meet the acceptability criteria, selecting a next test ODT scheme; and
    if signal integrity does meet the acceptability criteria, using the test ODT scheme as the alternative ODT scheme.

11. A computer program product for memory downsizing in a computer memory subsystem, the computer memory subsystem comprising one or more channels of computer memory, each channel comprising a plurality of Dual In-line Memory Modules ('DIMMs'), each DIMM capable of on-die termination ('ODT'), the computer program product disposed in a computer readable recording medium, the computer program product comprising computer program instructions capable of:
    identifying, during a memory initialization test in a Power On Self Test ('POST') by a firmware module, a defective DIMM of a particular channel in the computer memory subsystem;
    disabling, by the firmware module, the defective DIMM, including enabling ODT for the defective DIMM without disabling any non-defective DIMMs; and
    determining, by the firmware module, whether signal integrity for the computer memory subsystem meets acceptability criteria when ODT is enabled for the defective DIMM;
    if signal integrity meets the acceptability criteria, continuing, by the firmware module, the POST without disabling any non-defective DIMMs in the same particular channel as the defective DIMM.

12. The computer program product of claim 11 wherein:
    determining whether signal integrity for the computer memory subsystem meets acceptability criteria further comprises:
    generating, for each data strobe transmission line of each non-defective DIMM, an eye diagram of a signal transmitted along the data strobe transmission line with a predefined test bit pattern;
    calculating the width of the eye of the generated eye diagram; and
    determining whether the width is greater than a predetermined threshold width; and
    if the calculated width is greater than the predetermined threshold width, the method further comprises:
    identifying a center of the generated eye; and
    shifting signals transmitted along the data strobe transmission line according to the identified center.

13. The computer program product of claim 11 further comprising computer program instructions capable of, if signal integrity does not meet the acceptability criteria:
    disabling, by the firmware module, ODT for the defective DIMM;
    setting, by the firmware module, ODT values for non-defective DIMMs in the same particular channel as the defective DIMM according to an alternative ODT scheme;
    determining, by the firmware module, whether signal integrity for the computer memory subsystem meets acceptability criteria when ODT is set according to the alternative ODT scheme; and
    if signal integrity meets the acceptability criteria, continuing, by the firmware module, the POST without disabling any non-defective DIMMs in the same particular channel as the defective DIMM.

14. The computer program product of claim 13 further comprising computer program instructions capable of generating, by a manufacturer of the computer memory subsystem at manufacture time through use of a ODT scheme generator, the alternative ODT scheme, including:
    iteratively, for a plurality of test ODT schemes, until signal integrity under normal operating conditions meets acceptability criteria:
    disabling, by the ODT scheme generator, a particular DIMM in a channel of DIMMs and ODT of the particular DIMM;
    setting, by the ODT scheme generator, ODT values for other DIMMs in the same channel as the disabled DIMM according to a test ODT scheme;
    determining whether signal integrity for the channel of DIMMs under normal operating conditions meets acceptability criteria;
    if signal integrity does not meet the acceptability criteria, selecting a next test ODT scheme; and
    if signal integrity does meet the acceptability criteria, using the test ODT scheme as the alternative ODT scheme.

15. The computer program product of claim 13 further comprising computer program instructions capable of dynamically generating, by the firmware module upon determining that the ODT for the defective DIMM adversely affects signal integrity in the computer memory subsystem, the alternative ODT scheme, including:
    iteratively, for a plurality of test ODT schemes, until signal integrity under normal operating conditions meets acceptability criteria:
    setting ODT values for the non-defective DIMMs in the same particular channel as the defective DIMM according to a test ODT scheme;
    determining whether signal integrity for the particular channel of DIMMs under normal operating conditions meets acceptability criteria;
    if signal integrity does not meet the acceptability criteria, selecting a next test ODT scheme; and
    if signal integrity does meet the acceptability criteria, using the test ODT scheme as the alternative ODT scheme.

* * * * *